United States Patent [19]
Abe et al.

[11] Patent Number: 5,870,418
[45] Date of Patent: Feb. 9, 1999

[54] DRIVING CIRCUIT OF LASER DIODE AND OPTICAL TRANSMISSION DEVICE

[75] Inventors: Hajime Abe; Atsushi Takai, both of Kokubunji, Japan

[73] Assignee: Hitachi, Ltd., Tokyo, Japan

[21] Appl. No.: 886,254

[22] Filed: Jul. 1, 1997

Related U.S. Application Data

[63] Continuation of Ser. No. 614,029, Mar. 12, 1996, Pat. No. 5,675,599, which is a continuation of Ser. No. 124,124, Sep. 20, 1993, abandoned.

[30]     Foreign Application Priority Data

Sep. 24, 1992 [JP] Japan .................. 4-254359

[51] Int. Cl.$^6$ ........................................ H01S 3/00
[52] U.S. Cl. ............................................... 372/38
[58] Field of Search ............................ 372/20, 29–31, 372/33, 38; 455/69, 77, 102, 103, 115; 359/161, 162, 180, 181

[56] References Cited

U.S. PATENT DOCUMENTS

| | | | |
|---|---|---|---|
| 4,803,384 | 2/1989 | Yamane et al. | 372/38 |
| 4,833,680 | 5/1989 | Kaiser et al. | 372/29 |
| 5,027,362 | 6/1991 | Hokanson et al. | 372/38 |
| 5,127,015 | 6/1992 | Chikugawa et al. | 372/39 |
| 5,708,673 | 1/1998 | Ikeuchi | 372/38 |

OTHER PUBLICATIONS

Patent Abstracts of Japan, vol. 8, No. 115, 1984 & Jp–A–59 028 396 (Nippon Denki).

42nd Electronic Components and Technology Conference, May 1992, San Diego, US, pp. 115–119; Takai et al.: *Subsystem Optical Interconnections using Long–Wavelength LD and Singlemode–Fiber Arrays.*

The 1992 Spring Meeting of Electronic Information Communications Association; T. Odagawa et al.: *Lasting Delay Characteristics of Strained–Layer Quantum Well Lasers.*

OCS92–30, Aug. 5, 1992, pp. 31–38, A. Takai et al.: *Sub–Systems Optical Interconnections Using Long Wave–Length Laser Diode and Single–Mode Fiber Arrays.*

B–1008, Sep. 8, 1992, pp. 4–160, Hamasaki et al.: *APC Free Zero–Bias Modulcation of an Alignment–Free Optical Coupled 4–Channel Optical Module.*

*Primary Examiner*—Hemang Sanghavi
*Attorney, Agent, or Firm*—Kenyon & Kenyon

[57]    ABSTRACT

An optical transmission device which is used for a short range optical data link or an optical communication system for subscribers and more particularly requires no automatic optical power control minimizes the turn-on delay time of a laser diode and allows unformatted optical signal transmission by fixed level decision receiving system. By applying a fixed-bias electric current which is not more than the electric threshold current value of the laser diode to the laser diode, the turn-on delay time of the laser diode can be minimized, and the extinction level can be lowered by it, and the fixed level decision receiving system can be used, and the optical receiver circuit can be simplified more.

13 Claims, 4 Drawing Sheets

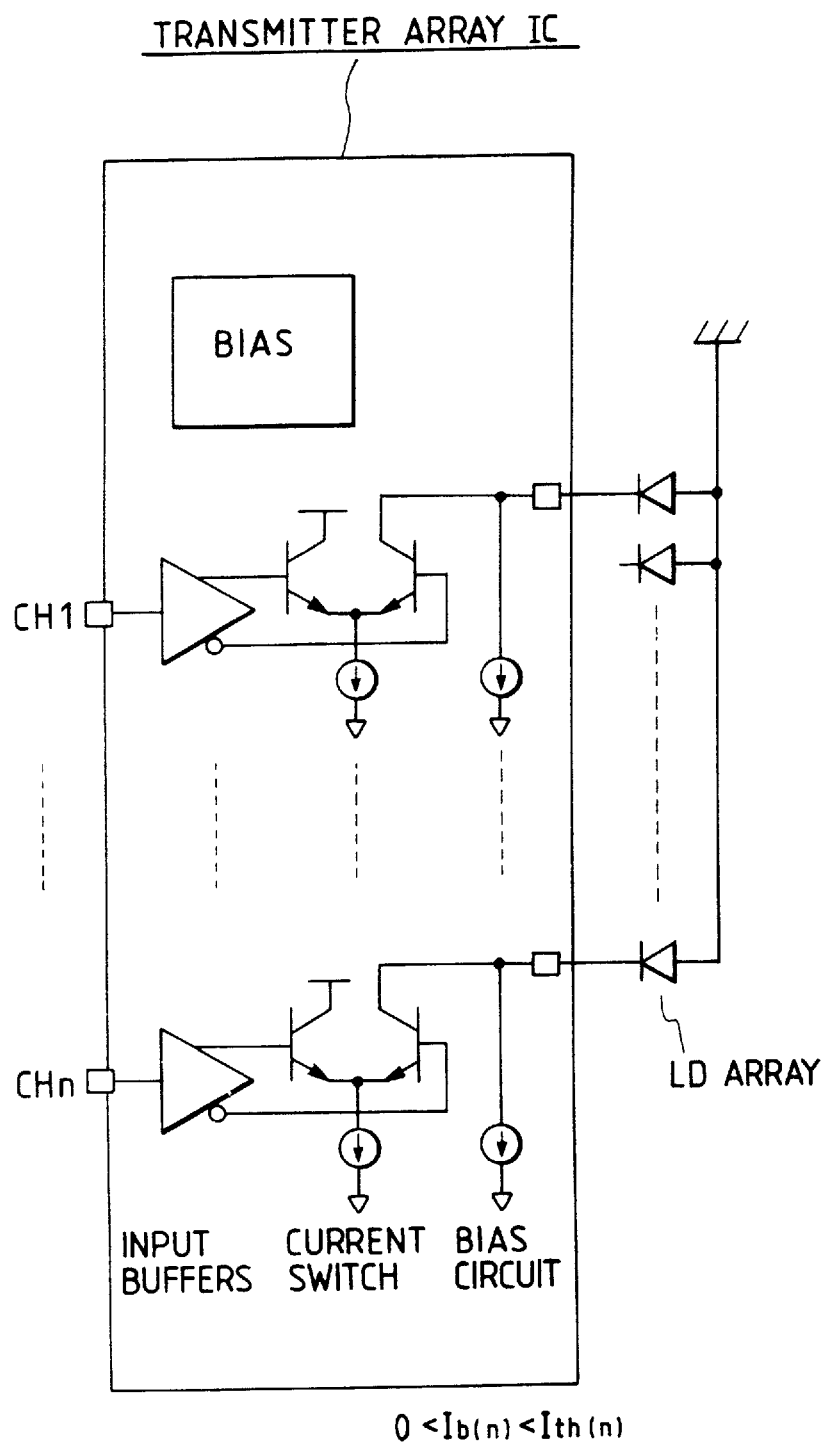

of application Ser. No. 08/614,029 filed 12 Mar. 1996, now U.S. Pat. No. 5,675,599 which is a continuation of application Ser. No. 08/124,124 filed 20 Sep. 1993, now abandoned.

DRIVING CIRCUIT OF LASER DIODE AND OPTICAL TRANSMISSION DEVICE

This is a continuation of application Ser. No. 08/614,029 filed 12 Mar. 1996, now U.S. Pat. No. 5,675 599 which is a continuation of application Ser. No. 08/124,124 filed 20 Sep. 1993, now abandoned.

BACKGROUND OF THE INVENTION

The present invention relates to an optical transmission device which is used for a short range optical data link or an optical communication system for subscribers and more particularly to an optical transmission device which requires no automatic optical power control.

PRIOR RELATED ART

When an automatic optical power control method, that is, "a control method for monitoring optical power of a laser diode, feeding back a bias current and electric modulation current, and obtaining fixed optical power from the laser diode without depending on changes in the electric threshold current value which are caused by temperature changes" is used, the circuit configuration becomes complicated.

Therefore, a great deal of attention has been recently given to driving a laser diode by zero-bias or fixed-bias.

One article "Sub-system optical interconnections using Long Wave-length Laser Diode and Single-mode Fiber Arrays" (1992 Technical Report of the Institute of Electronics, Information and Communication Engineers (Optical Communication System), OCS92-30, p 31), describes driving of a laser diode and unformatted optical signal transmission by fixed level decision receiving system.

On the other hand, the article, "APC Free Zero-Bias Modulation of an Alignment-free Optical Coupled 4-Channel Optical Module" (1992 Spring National Convention Record, The Institute of Electronics, Information and Communication Engineers, paper B-1008 (1992)), describes a fixed-bias driving experiment with a laser diode. In this second article, a bias electric current $I_b$ is set so that it becomes equal to an electric threshold current value Ith of the laser diode at a high temperature in the operating temperature area range ($I_b=I_{th}$ (at a high temperature)). When a non-return-to-zero coding (NRZ) signal having a mark ratio which is almost ½ is received, "0" or "1" is identified generally on the average received optical power level, so as to prevent the optical power of the laser diode at a high temperature from lowering. Because the electric threshold current value increases as the temperature rises.

Problems that the Invention is to Solve

However, in the state that the fixed-bias electric current is set so that it becomes equal to the electric threshold current value of the laser diode at a high temperature in an assumed operating temperature area range as in the second article, the fixed-bias electric current becomes larger than the electric threshold current value of the laser diode at a low temperature in the operating temperature area range ($I_b>I_{th}$ (at a low temperature)). Therefore, the optical power level (extinction level) increases when an electric input signal to the laser diode is off and it disturbs unformatted data optical transmission by fixed level decision receiving system described in the first article.

Namely, it is required to set the fixed decision level of the receiver side to a high value, so that the minimum optical power from the laser diode which is necessary to identify "1" on the receiver side increases.

As shown in a measurement example of turn-on delay time of the laser diode in FIG. 4a, when zero-bias driving is carried out for the laser diode, the turn-on delay time increases compared with that when a bias electric current is applied to this laser diode.

The present invention minimizes the turn-on delay time of a laser diode and allows unformatted optical signal transmission by fixed level decision receiving system.

Means of Solving the Problems

This accomplished by driving a laser diode in the state that a fixed-bias electric current which is not more than the electric threshold current value of the laser diode is applied by using a driving circuit of laser diode having a means of applying a fixed-bias electric current which is not more than the electric threshold current value.

By applying a fixed-bias electric current which is not more than the electric threshold current value of a laser diode to the laser diode, the turn-on delay time of the laser diode can be minimized.

Since the extinction level can be lowered, the fixed level decision receiving system can be used and the optical receiver circuit can be simplified.

Furthermore, the optical receiver circuit using the above constitution can be simplified compared with that when the automatic optical power control is applied.

BRIEF DESCRIPTION OF THE DRAWINGS

FIG. 5 shows an array example of the circuit of the embodiment shown in FIG. 1.

DETAILED DESCRIPTION

Figure 1:
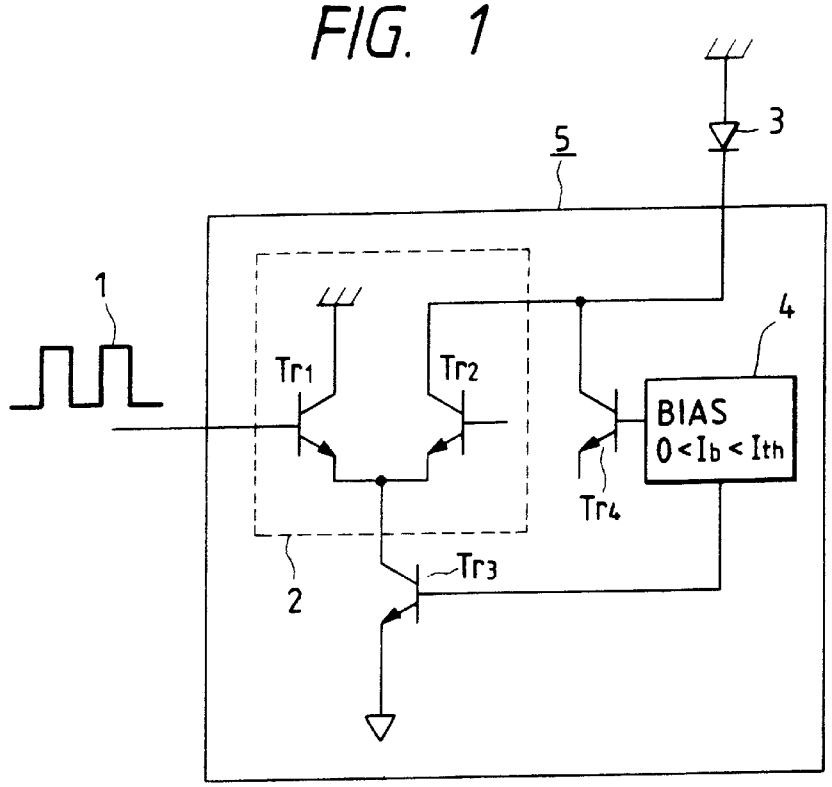
FIG. 1 shows an embodiment of the driving circuit of laser diode of the present invention.

FIG. 1 shows an embodiment of the driving circuit of laser diode of the present invention.

Figure 2:
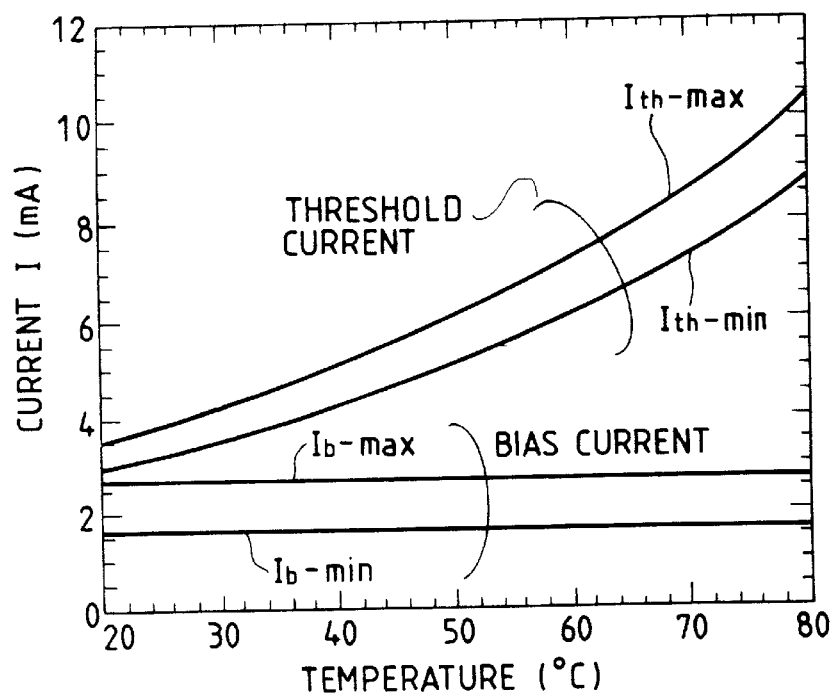
FIG. 2 is a drawing showing a bias electric current of the driving circuit of laser diode and the dependency of electric threshold current value of the laser diode on temperature.

An electric input signal 1 is supplied to a laser diode 3 via a current switch 2. A fixed-bias electric current $I_b$ which is not more than the electric threshold current value $I_{th}$ of the laser diode is applied to the laser diode 3 by a bias circuit 4. To produce the circuit, the Si bipolar IC process is used. FIG. 2 shows a bias electric current of the driving circuit of laser diode and the dependency of electric threshold current value of the laser diode on temperature which will be described later.

The bias electric current of a driving circuit of laser diode 5 ranges from 1.64 mA to 2.75 mA within the operating temperature area range from 20° C. to 80° C. under the condition that the supply voltage variation of the driving circuit is 10% and the resistance variation due to the production process variation is 20%.

On the other hand, the electric threshold current value of the laser diode 3 ranges from 2.92 mA to 10.33 mA within the operating temperature area range from 20° C. to 80° C. under the condition that the electric threshold current value at 25° C. when the characteristic temperature is 55° C., varies within a range from 3.2 mA to 3.8 mA.

When the laser diode 3 is mounted in the neighborhood of the driving circuit of laser diode 5 so as to make the temperatures of the two almost equal, the electric threshold current value of the laser diode 3 varies as shown in FIG. 2 within the entire temperature range from 20° C. to 80° C. and the bias electric current of the driving circuit of laser diode can be set less than the electric threshold current value of the laser diode actually on the side of the driving circuit of laser diode 5 regardless of characteristics of the laser diode 3 such as changes in the electric threshold current value due to changes in the temperature.

Figure 3:
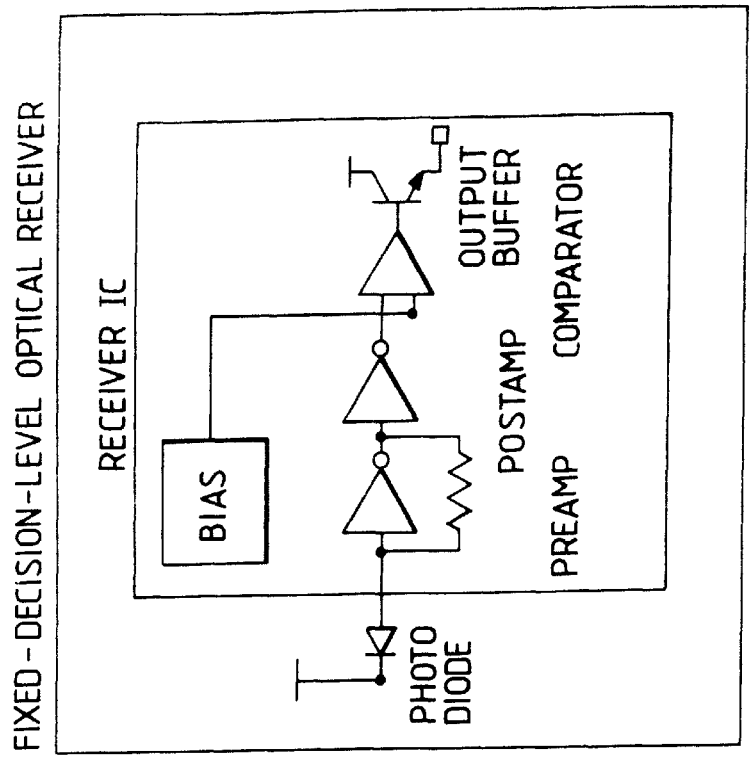
FIG. 3 is a drawing showing an optical transmission device using the driving circuit of laser diode.
Figure 3:
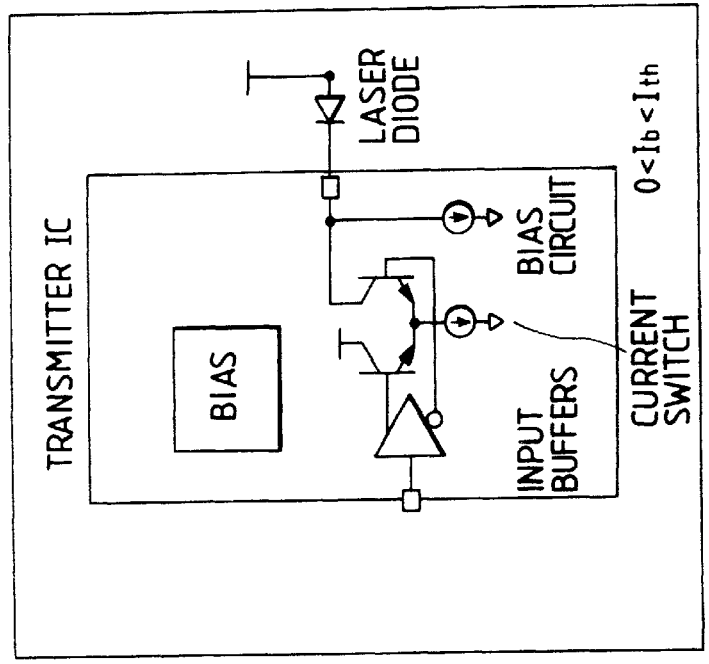

In the embodiment shown in FIGS. 1 and 2, since the bias electric current of the driving circuit of laser diode 5 is not more than the electric threshold current value of the laser diode, the extinction level is almost that of spontaneous emission light such as about −30 dBm. Furthermore, FIG. 3 shows an optical transmission device using the driving circuit of laser diode and the fixed level decision optical receiver described in the 1992 Technical Report referred to above.

Therefore, for example, by combining an optical transmission device having this constitution and the fixed level decision optical receiver described in that Technical Report, unformatted optical signal transmission can be carried out.

Figure 4A:
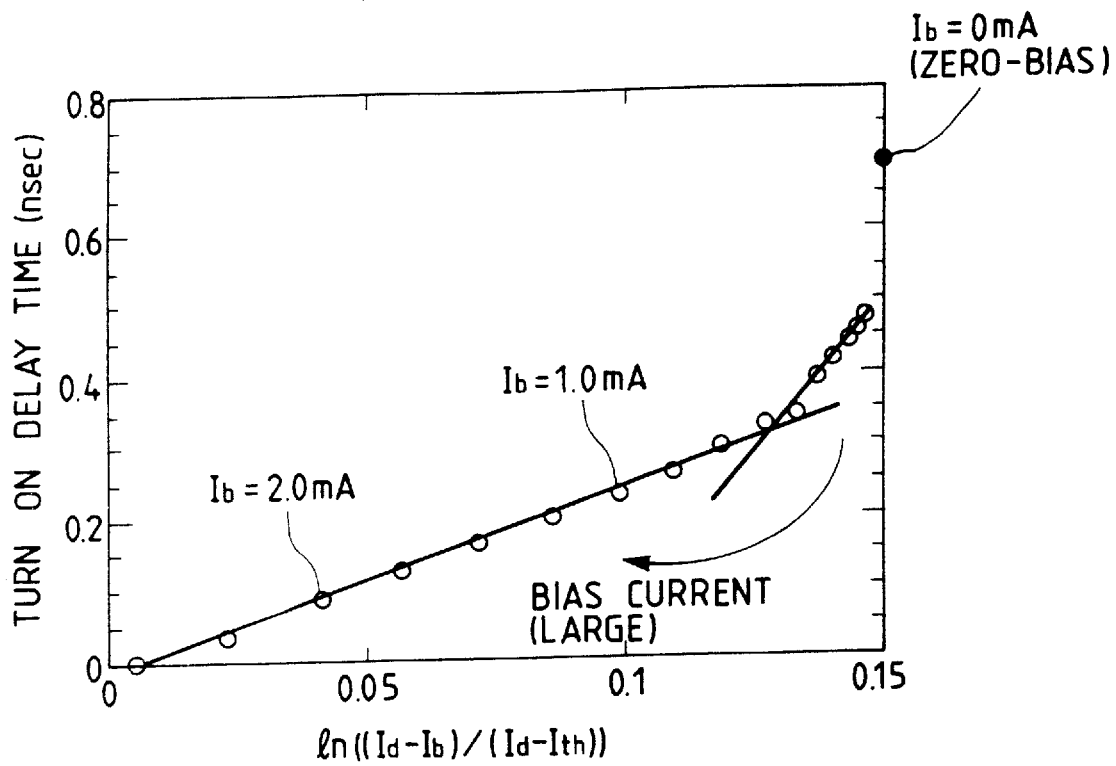
FIGS. 4a and 4b are drawings showing characteristics of the laser diode.
Figure 4B:
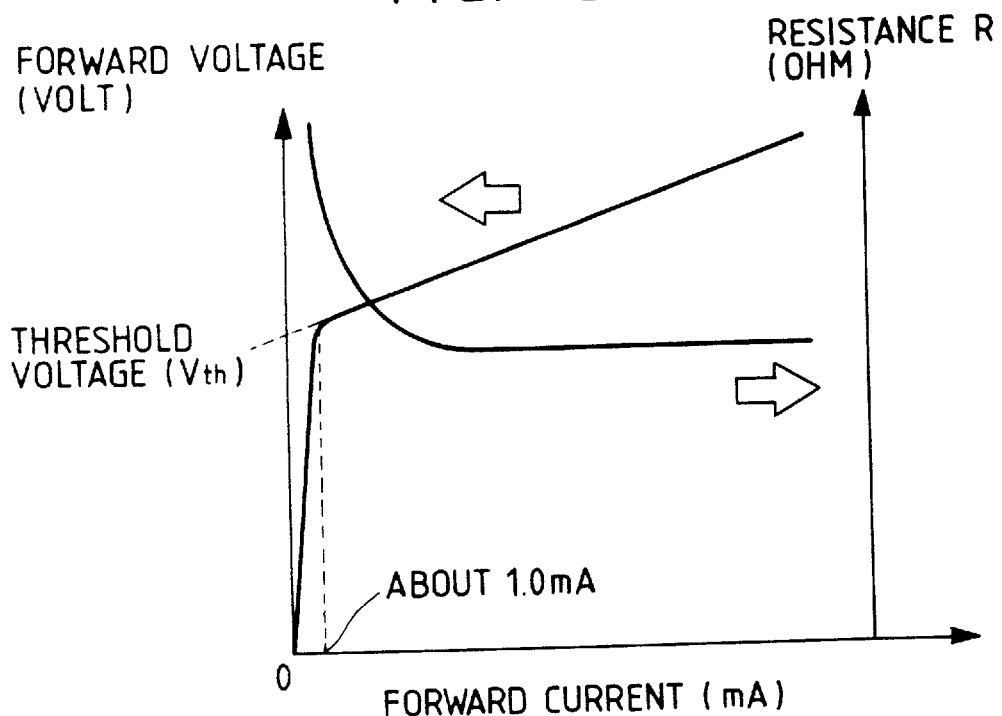

When a bias electric current of about 2.0 mA which is smaller than the electric threshold current value 2.8 mA of the laser diode is applied as shown in the example in FIG. 4($a$), for example, at 25° C., the turn-on delay time can be reduced to about 1/7 of that in the case of zero-bias driving.

FIGS. 4($a$) and 4($b$) show characteristic examples of the laser diode. FIG. 4($a$) shows the relationship between turn-on delay time $T_d$ and $\ln((I_d-I_b)/(I_d-I_{th}))$ when the driving current of laser diode $I_d$ is fixed at 20 mA and the bias electric current $I_b$ is changed at 25° C. The electric threshold current value Ith of this laser diode at 25° C. is 2.8 mA.

The increasing rate for turn-on delay time decreases from around the point where Ib becomes larger than 1.0 mA. It is found that the point is in the neighborhood of the current value corresponding to a threshold voltage Vth of $I_b$-V plot when the static characteristic graph (dependency of forward voltage and resistance on bias electric current) shown in FIG. 4($b$) is compared with FIG. 4($a$).

The semiconductor laser is a semiconductor device having a pn junction. Therefore, when a forward bias of approximately the built-in potential of the laser diode is given beforehand, the resistance of the laser diode decreases and an electric current can be easily supplied to the laser diode.

Therefore, when the bias electric current is preset above the current value corresponding to threshold voltage $V_{th}$ of $I_b$-V plot, variations of the turn-on delay time due to temperature changes of the laser diode can be minimized.

The manifestation of this embodiment can be realized, for example, by the following methods.

(i) An electric signal of all "0" is supplied to the driving circuit of laser diode and the emission light spectrum from the laser diode is observed. Namely, when the electric signal of all "0" is inputted, only a bias electric current smaller than the "electric threshold current value" is supplied to the laser diode, so that the laser diode generates no laser beam and the output optical spectrum is seen broad.

Therefore, by observing the emission light spectrum by an optical spectrum analyzer, it is found that the bias electric current of driving circuit of laser diode is smaller than the electric threshold current of the laser diode.

(ii) The coherence length of the emission light from the laser diode is changed greatly before and after the laser diode starts laser oscillation. Therefore, by observing the coherence length, it is found that the the bias electric current of driving current of driving circuit of laser diode is smaller than the electric threshold current of the laser diode.

In the embodiment shown in FIG. 1, the Si bipolar IC process is used to produce a driving circuit of laser diode. However, other bipolar, MOS, or FET systems may be used. The laser diode may be produced on a n-substrate, too.

In the above embodiment, an example that a bias electric current which is smaller than the electric threshold current value and larger than the current value corresponding to threshold voltage $V_{th}$ is applied to the laser diode is shown. However, there are no restrictions on it. A bias electric current which is smaller than the current value corresponding to $V_{th}$ may be applied depending on the system demands.

The driving circuit of the laser diode of the embodiment shown in FIG. 1 may be modified to a monolithic array circuit as shown in FIG. 5 as indicated in the 1992 Technical Report described in the background section of this specification. The circuit is a monolithic circuit consisting of a plurality of channels.

As mentioned above, by constructing a multi-channel optical transmitter having a laser diode array and a driving circuit array of laser diode array having a means of applying a fixed-bias electric current which is not more than each electric threshold current value of the laser diode array, a multi-channel optical transmitter having a small electric crosstalk can be constructed.

By combining this multi-channel optical transmitter with the fixed level decision optical receiver described in the prior art, a high-speed, unformatted data parallel optical signal transmission device which has a small crosstalk can be constructed.

Furthermore, a characteristic which is unrelated to the characteristics of the laser diode, for example, an intended temperature characteristic may be given to the fixed bias electric current of the driving circuit of laser diode.

What is claimed is:

1. An optical transmitter comprising: a laser diode having a threshold current value over which a laser oscillation occurs; and a transmitter integrated circuit including: a current switch supplying a driving current to the laser diode; and a bias circuit supplying a bias current (Ib) to the laser diode, said bias current (Ib) being independent from the laser oscillation output, and being smaller than the threshold current value (Ith) within a predetermined temperature range, but being larger than a current value corresponding to the threshold voltage of said laser diode, the larger current value providing a smaller turn-on delay time than the turn-on delay time at said current value corresponding to the threshold voltage of said laser diode.

2. An optical transmitter according to claim 1, wherein the current switch and the bias circuit each include at least one transistor and wherein the transistors in the current switch and the transistors in the bias circuit are of a same type.

3. An optical transmitter according to claim 2, wherein the transistors in the current switch and the transistors in the bias circuit are bipolar transistors.

4. An optical transmitter according to claim 2, wherein the transistors in the current switch and the transistors in the bias circuit are MOS transistors.

5. An optical transmitter according to claim 2, wherein the transistors in the current switch and the transistors in the bias circuit are field effect transistors.

6. An optical transmission device comprising: an optical transmitter comprising: a laser diode having a threshold current value (Ith) over which a laser oscillation occurs; and a transmitter integrated circuit including; a current switch supplying a driving current to the laser diode; and a bias circuit supplying a bias current to the laser diode, said bias current (Ib) being independent from the laser oscillation output, and being smaller than said threshold current value (Ib) within a predetermined temperature range, but being larger than a current value corresponding to the threshold voltage of said laser diode, the larger current value providing a smaller turn-on delay time than the turn-on delay time at said current value corresponding to the threshold voltage of said laser diode; an optical transmission path, one end of which is coupled to the optical transmitter; and a fixed-decision-level optical receiver coupled to another end of the optical transmission path.

7. An optical transmitter comprising: a plurality of laser diodes each having a threshold current value (Ith) over which a laser oscillation occurs; and a transmitter array integrated circuit including; current switches each supplying a driving current to a corresponding one of the laser diodes, and at least one bias circuit supplying a bias current (Ib) to the laser diodes, said bias current (Ib) being independent from the laser oscillation output, being smaller than said threshold current value (Ith) within a predetermined temperature range, and being larger than a current value corresponding to the threshold voltage of said laser diode, the larger current value providing a smaller turn-on delay time than the turn-on delay time at said current value corresponding to the threshold voltage of said laser diode.

8. An optical transmitter according to claim 7, wherein the current switches and the bias circuit each include at least one transistor and wherein the transistors in the current switches and the transistors in the bias circuit are of a same type.

9. An optical transmitter according to claim 8, wherein the transistors in the current switches and the transistors in the bias circuit are bipolar transistors.

10. An optical transmitter according to claim 8, wherein the transistors in the current switches and the transistors in the bias circuit are MOS transistors.

11. An optical transmitter according to claim 8, wherein the transistors in the current switches and the transistors in the bias circuit are field effect transistors.

12. An optical transmitter according to claim 8, wherein the transmitter array integrated circuit is monolithic.

13. An optical transmission device comprising: an optical transmitter including; a plurality of laser diodes each having a threshold current value (Ith) over which a laser oscillation occurs, and a transmitter array integrated circuit including: current switches each supplying a driving current to the corresponding laser diode, and at least one bias circuit supplying a bias current (Ib) to the laser diodes, said bias current (Ib) being independent from the laser oscillation output, being smaller than said threshold current value (Ith) within a predetermined temperature range, and being larger than a current value corresponding to the threshold voltage of said laser diode, the larger current value providing a smaller turn-on delay time than the turn-on delay time at said current value corresponding to the threshold voltage of said laser diode; an optical transmission path, one end of which is coupled to the optical transmitter; and a fixed-decision-level optical receiver coupled to another end of the optical transmission path.

* * * * *

UNITED STATES PATENT AND TRADEMARK OFFICE
CERTIFICATE OF CORRECTION

PATENT NO. : 5,870,418
DATED : 9 February 1999
INVENTOR(S) : Hajime ABE et al.

It is certified that error appears in the above-identified patent and that said Letters Patent is hereby corrected as shown below.

| Column | Line | |
|--------|------|---|
| 1 | 31 | After "describes" insert --zero-bias--. |
| 3 | 29 | Change "1n" to --ℓn--. |
| 4 | 17 | Change "background" to --Background--. |

Signed and Sealed this

Twentieth Day of June, 2000

Attest:

Q. TODD DICKINSON

Attesting Officer     Director of Patents and Trademarks